(12) United States Patent
Kim et al.

(10) Patent No.: US 9,013,098 B1
(45) Date of Patent: Apr. 21, 2015

(54) ORGANIC LIGHT EMITTING DISPLAY PANEL AND ORGANIC LIGHT EMITTING DISPLAY DEVICE INCLUDING THE SAME

(71) Applicant: LG Display Co., Ltd., Seoul (KR)

(72) Inventors: So Hyun Kim, Paju-si (KR); Young Ju Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/537,522

(22) Filed: Nov. 10, 2014

(30) Foreign Application Priority Data

Nov. 13, 2013 (KR) .................. 10-2013-0137372

(51) Int. Cl.
*H01L 51/52* (2006.01)
*H01L 27/32* (2006.01)

(52) U.S. Cl.
CPC ........ *H01L 27/3216* (2013.01); *H01L 27/3248* (2013.01)

(58) Field of Classification Search
CPC .................. H01L 27/3216; H01L 27/3248
See application file for complete search history.

(56) References Cited

U.S. PATENT DOCUMENTS

| 2007/0002084 | A1* | 1/2007 | Kimura et al. | 345/694 |
| 2009/0121983 | A1* | 5/2009 | Sung et al. | 345/76 |
| 2012/0169682 | A1* | 7/2012 | Kuhlman et al. | 345/205 |
| 2013/0057521 | A1* | 3/2013 | Kim | 345/204 |
| 2013/0113363 | A1* | 5/2013 | Hong | 313/498 |

* cited by examiner

*Primary Examiner* — Donald Raleigh
(74) *Attorney, Agent, or Firm* — Birch, Stewart, Kolasch & Birch, LLP

(57) ABSTRACT

Discussed is an organic light emitting display panel. The organic light emitting display panel includes a plurality of unit pixels which each include first to third sub-pixels having different colors. The plurality of unit pixels, which each include first to third driving transistors respectively connected to the first to third sub-pixels, a first contact hole that connects the first sub-pixel to the first driving transistor, a second contact hole that connects the second sub-pixel to the second driving transistor, and a third contact hole that connects the third sub-pixel to the third driving transistor, are arranged in a matrix type.

7 Claims, 7 Drawing Sheets

ORGANIC LIGHT EMITTING DISPLAY PANEL AND ORGANIC LIGHT EMITTING DISPLAY DEVICE INCLUDING THE SAME

CROSS-REFERENCE TO RELATED APPLICATIONS

This application claims the benefit of the Korean Patent Application No. 10-2013-0137372 filed on Nov. 13, 2013, which is hereby incorporated by reference as if fully set forth herein.

BACKGROUND

1. Field of the Invention

The present invention relates to an organic light emitting display panel, and more particularly, to an organic light emitting display panel in which an arrangement structure of sub-pixels is changed to widen a width of an organic emission layer.

2. Discussion of the Related Art

A flat panel display (FPD) device is applied to various electronic devices such as portable phones, tablet personal computers (PCs), notebook computers, monitors, etc. Examples of the FPD device include liquid crystal display (LCD) devices, plasma display panel (PDP) devices, organic light emitting display devices, etc. Recently, electrophoretic display (EPD) devices are being widely used as one type of the FPD device.

Among the display devices, the organic light emitting display devices use a self-emitting element, and thus have a fast response time, high emission efficiency, high luminance, and a broad viewing angle.

The organic light emitting display devices may be configured in a top emission type where an organic light emitting diode (OLED) is formed on a lower substrate, and light emitted from the OLED is output to the outside through an upper substrate.

Moreover, the organic light emitting display devices may be configured in a bottom emission type where the OLED is formed on the lower substrate, and the light emitted from the OLED is transferred to the lower substrate.

Recently, organic light emitting display devices that emits light in a dual emission type where the bottom emission type is combined with the top emission type are being developed.

FIG. 1 is a first exemplary diagram illustrating a related art organic light emitting display panel 10, and particularly, is an exemplary diagram illustrating an organic light emitting display device in which a plurality of sub-pixels are arranged in a stripe structure.

A plurality of sub-pixels 11 applied to the related art organic light emitting display panel 10, as illustrated in FIG. 1, are arranged in the stripe structure.

A plurality of contact holes (PLN Hole) 13 illustrated in FIG. 1 may be formed in the organic light emitting display panel 10 so that a driving transistor, e.g., a driving thin film transistor (TFT), used to drive an OLED 12 is electrically connected to the OLED 12.

For example, the driving TFT (not shown) is insulated from the OLED 12 by an insulation layer (not shown). Therefore, the contact hole 13 may be formed on the insulation layer so that the driving TFT and the OLED 12 separated from each other by the insulation layer are electrically connected.

In this case, as illustrated in FIG. 1, the contact holes 13 are respectively formed at the same positions of lower ends of all the sub-pixels 11.

In the related art organic light emitting display panel 10, since the contact holes are respectively formed at the same positions of the lower ends of the sub-pixels 11, enhancement of an aperture ratio is limited when the sub-pixels 11 are formed by using a fine metal mask (FMM). That is, since each of the contact holes 13 is disposed adjacent to a boundary between adjacent sub-pixels, an emission area of each sub-pixel is reduced. Also, the fine metal mask has a pattern so as to correspond to one sub-pixel, and it is required to manufacture a smaller pattern when manufacturing a high-resolution organic light emitting display panel. However, there is a limitation in manufacturing a smaller pattern. The fine metal mask is a mask that is used to deposit an organic emission layer in units of a pixel in an organic light emitting display panel, and has a fine pattern. Therefore, the pattern of the fine metal mask should be further reduced in the high-resolution organic light emitting display panel, and for this reason, it is difficult to form a structure of the sub-pixels illustrated in FIG. 1. For example, in an organic light emitting display panel having a high resolution of 300 ppi or more, it is difficult to form the structure of the sub-pixels illustrated in FIG. 1.

That is, a resolution of organic light emitting display panels becomes increasingly higher, but due to the above-described structure of the sub-pixels of the related art, it is difficult to manufacture the high-resolution organic light emitting display panel.

To provide an additional description, as the resolution of an organic light emitting display panel increases, a size of a sub-pixel is reduced. In this case, the thickness of the fine metal mask used to manufacture the organic light emitting display panel is limited, and since a distance between ribs of the fine metal mask is insufficient, a desired aperture ratio cannot be realized in the organic light emitting display panel using the structure of sub-pixels of the related art. That is, in the process of evaporating an organic emission layer by using an evaporation process, due to a limitation of a method of manufacturing the fine metal mask, it is difficult to manufacture an organic light emitting display panel having a high resolution.

SUMMARY OF THE INVENTION

Accordingly, the present invention is directed to provide an organic light emitting display panel and an organic light emitting display device including the same that substantially obviate one or more problems due to limitations and disadvantages of the related art.

An aspect of the present invention is directed to provide a new arrangement structure of sub-pixels in which an organic light emitting display panel, which has the same resolution as that of a related art organic light emitting display panel because a size of a unit pixel is the same, expresses a better sense of color than the related art organic light emitting display panel.

Another aspect of the present invention is directed to provide an arrangement structure of sub-pixels which enables a high-resolution unit pixel to be formed.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display panel including a plurality of unit pixel which each include first to third sub-pixels having different colors, wherein the plurality of unit pixels each include first to third driving transistors respectively connected to the first to third sub-pixels, a first contact hole that connects the first sub-pixel to the first driving transistor, a second contact hole that connects the second sub-pixel to the second driving transistor, and a third contact hole that connects the third sub-pixel to the third driving transistor, and are arranged in a matrix type. Here, a plurality of the first sub-pixels are arranged adjacent to each other in unit pixels which are adjacent to each other in a first direction, a plurality of the third sub-pixels are arranged adjacent to each other at a boundary of respectively adjacent two unit pixels, wherein the two adjacent unit pixels form a unit pixel pair, and a plurality of second sub-pixels, wherein the second sub-pixel of a pixel unit is adjacent to the third sub-pixel in the unit pixel in the first direction, and is arranged farther apart from the boundary of the two adjacent unit pixels of the unit pixel pair than the third sub-pixels of the unit pixel pair. In this case, in unit pixels which are adjacent to each other in the vertical direction, sub-pixels configuring each unit pixel may be disposed adjacent to sub-pixels of the same color. Accordingly, the present invention can enhance a sense of color.

The first to third contact holes may be disposed adjacent to a boundary of the unit pixels which are adjacent to each other in the first direction. In this case, the contact holes may be disposed in one row in a certain direction, thereby enabling a fine metal mask to be easily manufactured.

The first contact hole may be disposed between a plurality of the sub-pixels which are adjacent to each other in the first direction, and the second and third contact holes may be disposed between the second sub-pixel and the third sub-pixel of a respective pixel unit. In this case, the second and third contact holes configuring a unit pixel may be disposed adjacent to second and third contact holes configuring an adjacent unit pixel, and a fine metal mask for enhancing an aperture ratio can be manufactured. In particular, in manufacturing a high-resolution organic light emitting display panel, the manufacturing of the fine metal mask is limited, but the present invention overcomes the limitation, and enables a finer sub-pixel to be manufactured.

The first sub-pixel comprises an upper sub-pixel and a lower sub-pixel in the unit pixel, the first contact hole may be disposed between the upper sub-pixel and the lower sub-pixel of the pixel unit, and the second and third contact holes may be disposed between the second sub-pixel and the third sub-pixel of the pixel unit.

The first to third contact holes may be arranged in parallel in a second direction, wherein the second direction is perpendicular to the first direction.

The first to third sub-pixels may be disposed adjacent to one of first to third sub-pixels, included in an adjacent unit pixel, at a boundary of unit pixels. In this case, sub-pixels included in a unit pixel may be disposed in parallel, and thus, a mask can be easily manufactured. Also, first to third sub-pixels included in a unit pixel may be disposed adjacent to first to third sub-pixels adjacent thereto. Accordingly, the present invention can contribute to increase a width of an emission area.

The first sub-pixel may be greater than the second and third sub-pixels, and may include a blue organic emission layer. In this case, even though an emission efficiency of a blue sub-pixel is lower than that of red and green sub-pixels in an organic light emitting display panel, since the blue sub-pixel is greater than the red and green sub-pixels, the red, green, and blue sub-pixels can have the same luminance.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1:
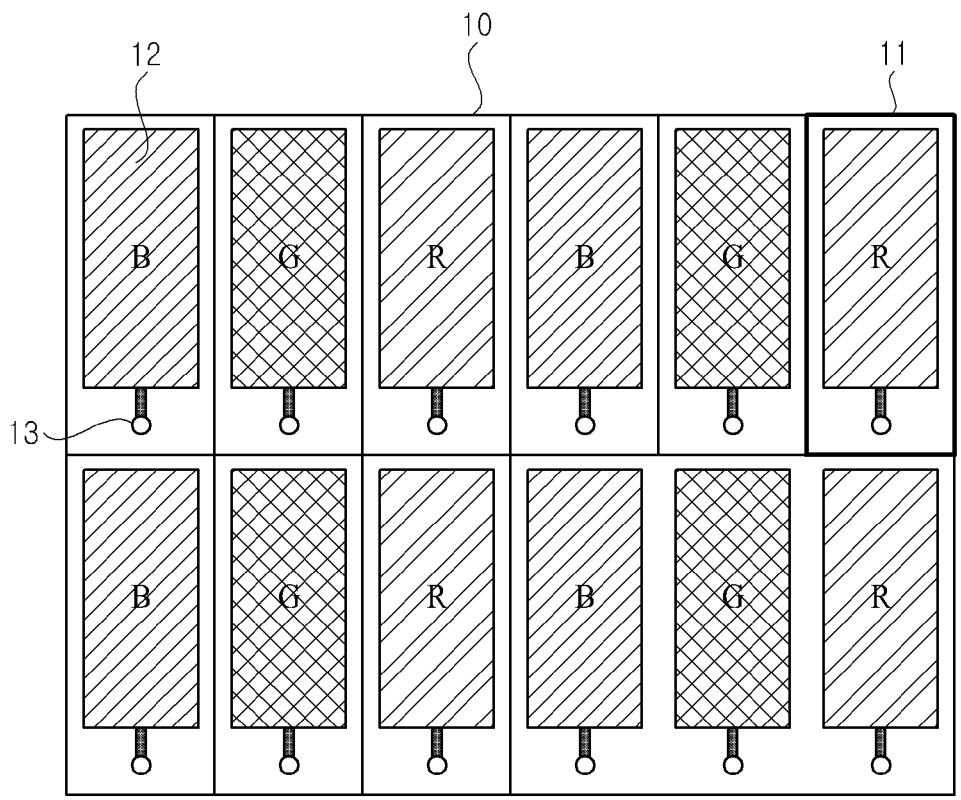
FIG. 1 is a first exemplary diagram illustrating a related art organic light emitting display panel.
Figure 2:
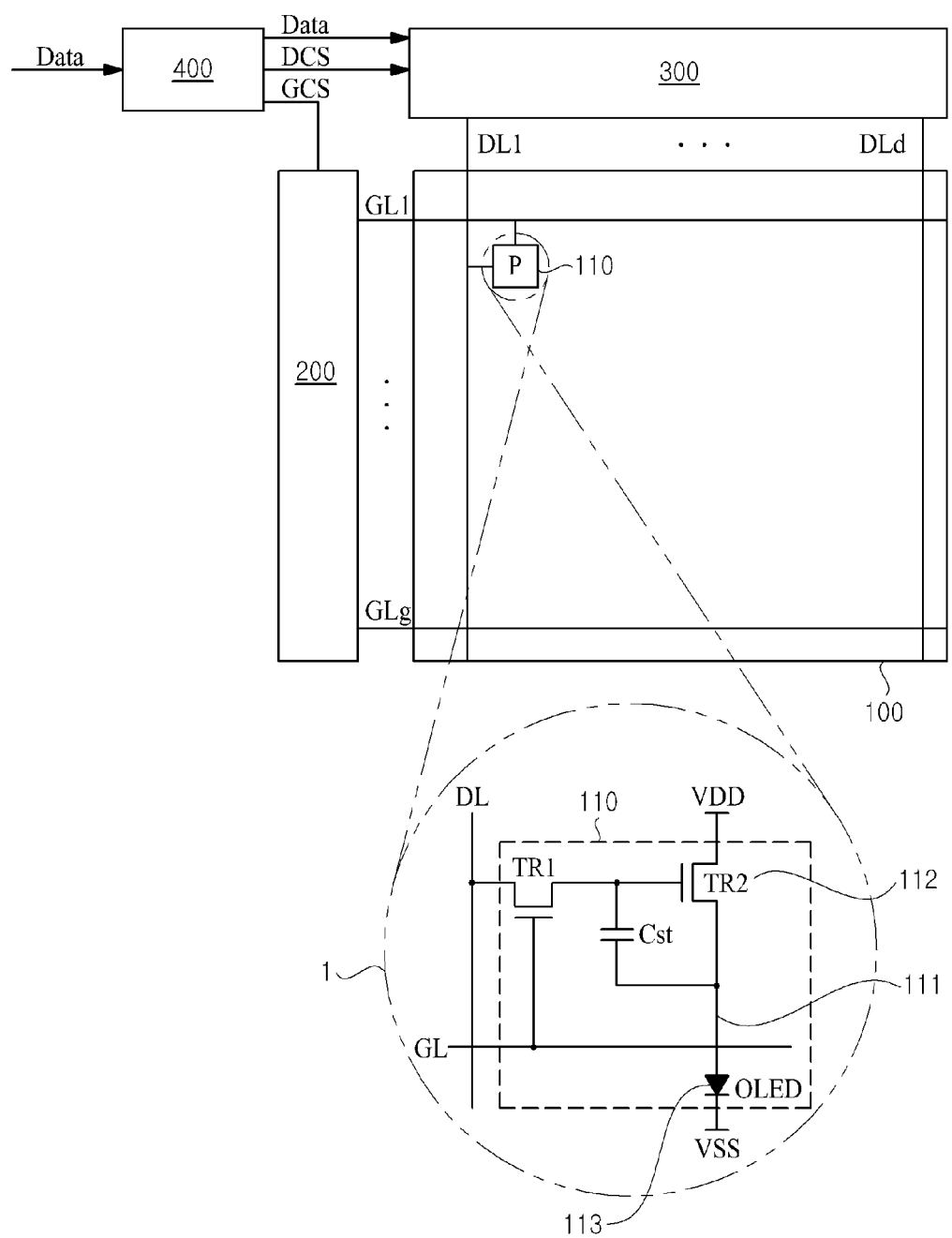
FIG. 2 is a block diagram of an organic light emitting display device according to an embodiment of the present invention.

FIG. 2 is a block diagram of an organic light emitting display device according to an embodiment of the present invention.

The embodiments of the present invention relate to a pixel arrangement structure of an organic light emitting display panel. Generally, since there is a limitation in manufacturing a fine metal mask, there is a limitation in manufacturing a high-resolution organic light emitting display panel by using an evaporation process. To solve such a limitation, the embodied present invention provides an organic light emitting display panel, in which an arrangement structure of sub-pixels is changed to realize a high resolution, and an organic light emitting display device including the same.

In an organic light emitting display panel having a related art pixel structure, in order to electrically connect a driving thin film transistor (TFT) and an organic light emitting diode (OLED) which are separated from each other by an insulation layer, a contact hole formed in the insulation layer is formed adjacent to a boundary between vertically adjacent unit pixels. Therefore, when an organic emission layer is deposited by using a fine metal mask, there is a risk in which the organic emission layer is deposited in the contact hole, and for this reason, a plurality of the organic emission layers cannot be deposited at one time. However, according to an embodiment of the present invention, the plurality of organic emission layers may be deposited at one time.

An organic light emitting display device according to an embodiment of the present invention, as illustrated in FIG. 2, includes an organic light emitting display panel 100 including a plurality of sub-pixels 110 and a driver that drives the organic light emitting display panel 100. All the components of the device are operatively coupled and configured. Here, in the organic light emitting display panel 100, a sub-pixel P is formed in each of intersection areas between a plurality of gate lines GL1 to GLg and a plurality of data lines DL1 to DLd. Also, the driver includes a gate driver 200 that sequentially supplies a gate pulse to the gate lines GL1 to GLg formed in the organic light emitting display panel 100, a data driver 300 that respectively supplies data voltages to the data lines DL1 to DLd formed in the organic light emitting display panel 100, and a timing controller 400 that controls functions of the gate driver 200 and the data driver 300.

First, in the organic light emitting display panel 100, a sub-pixel (P) 110 is formed in each of the intersection areas between the plurality of gate lines GL and the plurality of data lines DL. The sub-pixel 110 is for expressing red, green or blue, and a blue sub-pixel, a red sub-pixel, and a green sub-pixel configure one unit pixel. That is, the one unit pixel includes the blue sub-pixel, the red sub-pixel, and the green sub-pixel.

The sub-pixel 110, as illustrated in an enlarged circle 1 of FIG. 2, may include an organic light emitting diode OLED, at least two or more transistors TR1 and TR2 which are connected to a data line DL and a gate line GL to control the organic light emitting diode OLED, and a storage capacitor Cst. Hereinafter, a first transistor TR1 is referred to as a switching TFT, and a second transistor 112 is referred to as a driving TFT.

First, the organic light emitting diode 113 includes a first electrode, an organic emission layer formed on the first electrode, and a second electrode formed on the organic emission layer. Here, the first and second electrodes may respectively be an anode electrode and a cathode electrode, or may respectively be a cathode electrode and an anode electrode.

The anode electrode of the organic light emitting diode OLED is connected to a first power source VDD, and the cathode electrode is connected to a second power source VSS. The organic light emitting diode OLED emits light having certain luminance in correspondence with a current supplied from the second transistor 112.

Second, when the gate pulse is supplied to the gate line GL, various circuits included in the sub-pixel 110 control an amount of current supplied to the organic light emitting diode OLED in order for a current, corresponding to an image signal supplied to the data line DL, to be supplied to the organic light emitting diode OLED.

To this end, the sub-pixel 110 includes: the driving TFT 112 connected between the first power source VDD and the organic light emitting diode 113; the switching TFT TR1 connected to the driving TFT 112, the data line DL, and the gate line GL; and a storage capacitor Cst connected between a gate electrode of the driving TFT 112 and the organic light emitting diode 113. In FIG. 2, a sub-pixel according to an embodiment of the present invention is schematically illustrated, and particularly, the sub-pixel 100 including two transistors and one capacitor is illustrated. However, the sub-pixel 100 may be configured in various types with various compensation transistors.

Moreover, as illustrated in FIG. 2, the anode electrode or cathode electrode of the organic light emitting diode 113 is connected to the driving TFT 112 through a connection line 111. The connection line 111 may be, for example, a line connected to the anode electrode or a line which is formed as one body with the anode electrode.

A detailed configuration of one or more examples of the organic light emitting display panel 100 will be described in detail with reference to FIGS. 3 to 7.

The timing controller 400 outputs a gate control signal GCS for controlling the data driver 200 and a data control signal DCS for controlling the data driver 300 by using a vertical sync signal, a horizontal sync signal, and a clock signal which are supplied from an external system.

Moreover, the timing controller 400 samples input video data input from the external system, realigns the sampled video data, and supplies the realigned digital image data RGB to the data driver 300.

That is, the timing controller 400 realigns the input video data supplied from the external system, and transfers the realigned digital image data to the data driver 300. The timing controller 400 generates the gate control signal GCS for controlling the data driver 200 and the data control signal DCS for controlling the data driver 300 by using the clock signal, the vertical sync signal, the horizontal sync signal, and a data enable signal which are supplied from an external system, and respectively transfers the gate control signal GCS and the data control signal DCS to the gate driver 200 and the data driver 300. Here, the clock signal, the vertical sync signal, and the horizontal sync signal are referred to as a timing signal.

To this end, the timing controller 400 includes: a receiver that receives the various signals such as the input video data supplied from the external system; an image data processor that realigns the input video data among the signals received by the receiver so as to match a structure of the panel 110, and generates the realigned digital image data; a control signal generator that generates the gate control signal GCS and the data control signal DCS for respectively controlling the gate driver 200 and the data driver 300 by using the signals received from the receiver; and a transferor that outputs the gate control signal GCS to the gate driver 200 and outputs the data control signal DCS and the image data, generated by the image data processor, to the data driver 300.

The data driver 300 converts the image data, input from the timing controller 400, into analog data voltages and respectively supplies the data voltages for one horizontal line to the data lines at every one horizontal period in which the scan pulse is supplied to a corresponding gate line. That is, the data driver 300 converts the image data into the data voltages by using gamma voltages supplied from a gamma voltage generator, and respectively outputs the data voltages to the data lines.

The data driver 300 shifts a source start pulse (SSP) input from the timing controller 400 according to a source shift clock (SSC) to generate a sampling signal. The data driver 300 latches pixel data RGB (image data) according to the sampling signal to convert the image data into data voltages, and respectively supplies the data voltages to the data lines in units of a horizontal line in response to a source output enable signal (SOE).

To this end, the data driver 300 may include a shift register, a latch, a digital-to-analog converter (DAC), and an output buffer.

The shift register outputs the sampling signal by using control signals received from the timing controller 400.

The latch latches the digital image data Data that are sequentially received from the timing controller 400, and simultaneously outputs the digital image data to the DAC.

The DAC simultaneously converts the image data Data, transferred from the latch, into positive or negative data voltages, and outputs the positive or negative data voltages. That is, the DAC converts the image data into the positive or negative data voltages according to a polarity control signal transferred from the timing controller 400, by using the gamma voltages supplied from the gamma voltage generator (not shown), and respectively outputs the positive or negative data voltages to the data lines.

The output buffer outputs the data voltages, transferred from the DAC, to the data lines DL1 of the organic light emitting display panel 100 according to the source output enable signal (SOE) transferred from the timing controller 400.

The gate driver 200 sequentially supplies a gate pulse to the gate lines GL1 to GLg of the organic light emitting panel 100 in response to the gate control signal GCS input from the timing controller 400. Therefore, the switching TFTs of respective sub-pixels 110 on a corresponding horizontal line receiving the gate pulse are turned on, and an image is output to the sub-pixels 110.

That is, the gate driver 200 shifts a gate start pulse (GSP) transferred from the timing controller 400 according to a gate shift clock (GSC), and sequentially supplies the gate pulse having a gate-on voltage (Von) to the gate lines GL1 to GLg. During the other period in which the gate pulse having the gate-on voltage (Von) is not supplied, the gate driver 200 supplies a gate-off voltage (Voff) to the gate lines GL1 to GLg.

The gate driver 200 may be provided independently from the organic light emitting display panel 100, and may be implemented in a type which is electrically connectable to the organic light emitting display panel 100 in various methods. However, the gate driver 200 may be implemented in a gate-in panel (GIP) type which is equipped in the organic light emitting display panel 100. In this case, the gate control signals for controlling the gate driver 200 may include a start signal (VST) and a gate clock (GCLK).

Moreover, in the above description, the data driver 300, the gate driver 200, and the timing controller 400 are illustrated as being separately provided, but at least one selected from the data driver 300 and the gate driver 200 may be provided as one body with the timing controller 400.

Figure 3:
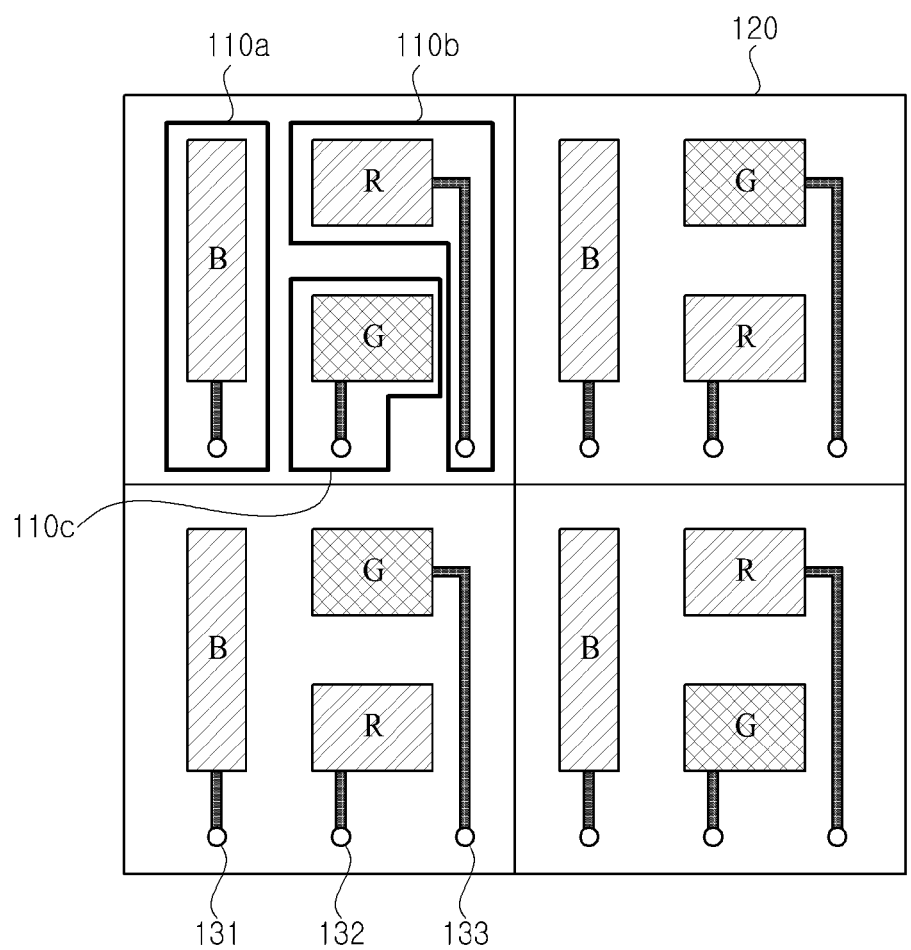
FIG. 3 is an exemplary diagram illustrating a plane structure of an organic light emitting display panel according to a first embodiment of the present invention.

FIG. 3 is an exemplary diagram illustrating a plane structure of an organic light emitting display panel according to a first embodiment of the present invention, and particularly, illustrates a configuration of each of sub-pixels configuring the organic light emitting display panel.

The organic light emitting display panel according to the first embodiment of the present invention, as illustrated in FIG. 3, includes a first sub-pixel 110a, a second sub-pixel 110b, and a third sub-pixel 110c which have different colors. In the organic light emitting display panel according to the first embodiment of the present invention, a plurality of unit pixels 120, which each include first to third driving TFTs respectively connected to the first to third sub-pixels 110a to 110c, a first contact hole 131 that connects the first sub-pixel 110a to the first driving TFT, a second contact hole 132 that connects the second sub-pixel 110b to the second driving TFT, and a third contact hole 133 that connects the third sub-pixel 110c to the third driving TFT, are arranged in a matrix type. A plurality of the first sub-pixels 110a are arranged in a stripe type in unit pixels which are adjacent to each other in a vertical direction (a first direction), and a plurality of the third sub-pixels 110c are arranged adjacent to each other at a boundary of adjacent unit pixels. The second sub-pixel 110b is adjacent to the third sub-pixel 110c in a unit pixel, and is arranged farther apart from the boundary than the third sub-pixel 110c.

In particular, in the first embodiment of the present invention, the first to third contact holes 131 to 133 are disposed adjacent to a boundary of the unit pixels 120 which are adjacent to each other in the vertical direction (the first direction).

Figure 4:
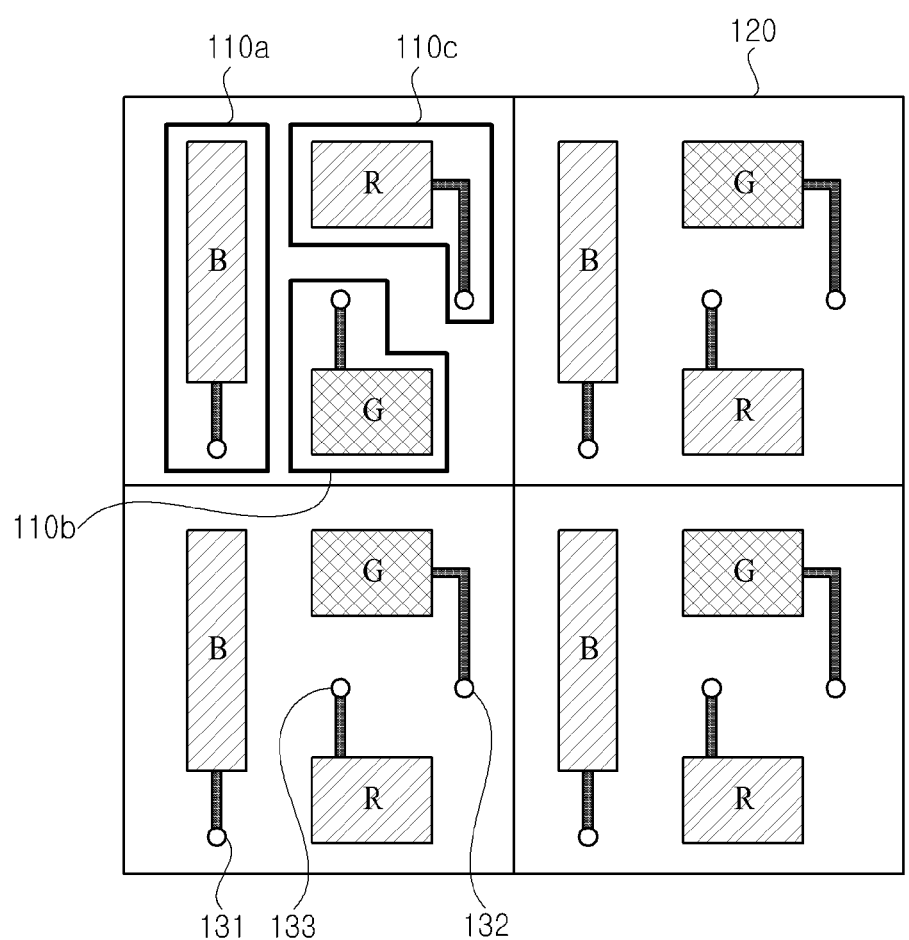
FIG. 4 is an exemplary diagram illustrating a plane structure of an organic light emitting display panel according to a second embodiment of the present invention.

FIG. 4 is an exemplary diagram illustrating a plane structure of an organic light emitting display panel according to a second embodiment of the present invention, and particularly, illustrates a configuration of each of sub-pixels configuring the organic light emitting display panel.

The organic light emitting display panel according to the second embodiment of the present invention, as illustrated in FIG. 4, includes a first sub-pixel 110a, a second sub-pixel 110b, and a third sub-pixel 110c which have different colors. In the organic light emitting display panel according to the second embodiment of the present invention, a plurality of unit pixels 120, which each include first to third driving TFTs respectively connected to the first to third sub-pixels 110a to 110c, a first contact hole 131 that connects the first sub-pixel 110a to the first driving TFT, a second contact hole 132 that connects the second sub-pixel 110b to the second driving TFT, and a third contact hole 133 that connects the third sub-pixel 110c to the third driving TFT, are arranged in a matrix type. A plurality of the first sub-pixels 110a are arranged in a stripe type in unit pixels which are adjacent to each other in a vertical direction (a first direction), and a plurality of the third sub-pixels 110c are arranged adjacent to each other at a boundary of adjacent unit pixels. The second sub-pixel 110b is adjacent to the third sub-pixel 110c in a unit pixel, and is arranged farther apart from the boundary than the third sub-pixel 110c.

In particular, in the second embodiment of the present invention, the first contact hole 131 is disposed between a plurality of the sub-pixels 110a which are adjacent to each other in the vertical direction, and the second and third contact holes 132 and 133 are disposed between the second sub-pixel 110b and the third sub-pixel 110c within a respective unit pixel.

Figure 5:
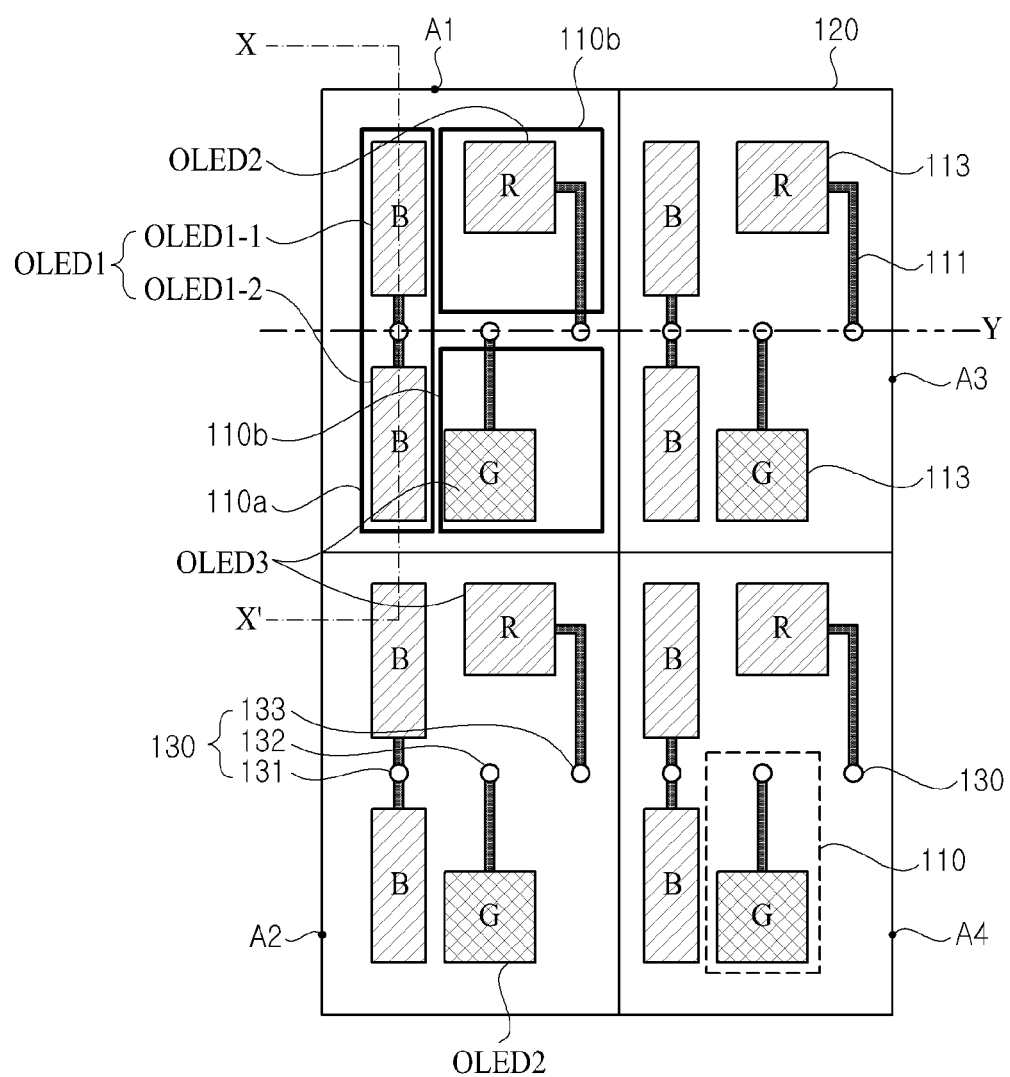
FIG. 5 is an exemplary diagram illustrating a plane structure of an organic light emitting display panel according to a third embodiment of the present invention.

FIG. 5 is an exemplary diagram illustrating a plane structure of an organic light emitting display panel according to a third embodiment of the present invention, and particularly, illustrates a configuration of each of sub-pixels configuring the organic light emitting display panel.

The organic light emitting display panel according to the third embodiment of the present invention, as illustrated in FIG. 5, includes a first sub-pixel 110a, a second sub-pixel 110b, and a third sub-pixel 110c which have different colors. In the organic light emitting display panel according to the third embodiment of the present invention, a plurality of unit pixels 120, which each include first to third driving TFTs respectively connected to the first to third sub-pixels 110a to 110c, a first contact hole 131 that connects the first sub-pixel 110a to the first driving TFT, a second contact hole 132 that connects the second sub-pixel 110b to the second driving TFT, and a third contact hole 133 that connects the third sub-pixel 110c to the third driving TFT, are arranged in a matrix type. A plurality of the first sub-pixels 110a are arranged in a stripe type in unit pixels which are adjacent to each other in a vertical direction (a first direction), and a plurality of the third sub-pixels 110c are arranged adjacent to each other at a boundary of adjacent unit pixels. The second sub-pixel 110b is adjacent to the third sub-pixel 110c in a unit pixel, and is arranged farther apart from the boundary than the third sub-pixel 110c.

In particular, in the third embodiment of the present invention, in order for a high-resolution pixel structure to be applied, a bank is formed in the first sub-pixel 110a by using a slit mask, and the first sub-pixel 110a is divided into two segments. Also, in the third embodiment of the present invention, a bank is formed between the second and third sub-pixels 110b and 110c which are disposed in a vertical direction.

The organic light emitting display panel according to the third embodiment of the present invention, as illustrated in FIG. 5, includes the plurality of unit pixels 120, and each of the unit pixels 120 includes a blue sub-pixel for expressing blue, a red sub-pixel for expressing red, and a green sub-pixel for expressing green.

For example, each of the unit pixels 120 includes three sub-pixels 110a to 110c, which may be the blue sub-pixel 110a, the red sub-pixel 110b, and the green sub-pixel 110c.

White and black may be expressed by a combination of the sub-pixels 110.

Hereinafter, for convenience of description, the organic light emitting display panel according to the embodiments of the present invention will be described on the assumption that the blue sub-pixel is the blue sub-pixel 110a, the red sub-pixel is the red sub-pixel 110b, and the green sub-pixel is the green sub-pixel 110c.

The first sub-pixel 110a includes a first organic light emitting diode OLED1 that expresses blue B, the second sub-pixel 110b includes a second organic light emitting diode OLED2 that expresses red, and the third sub-pixel 110c includes a third organic light emitting diode OLED3 that expresses green. Here, the first organic light emitting diode OLED1 may be divided into a first sub organic light emitting diode OLED1_1 and a second sub organic light emitting diode OLED1_2. That is, the first sub-pixel 110a including the first organic light emitting diode OLED1 is divided into two sub-pixels, namely, an upper sub-pixel and a lower sub-pixel. A contact hole 131 is formed between the upper sub-pixel and the lower sub-pixel. Hereinafter, a generic name for the first and second organic light emitting diodes OLED1_1 and OLED1_2 is simply referred to as a first organic light emitting diode OLED1.

Each of the first to third organic light emitting diodes OLED1 to OLED3 may be configured with a white light emitting diode. In this case, it may be understood that the first to third organic light emitting diodes include a blue color filter, a red color filter, and a green color filter, respectively.

Therefore, each of the unit pixels 120 includes the first sub-pixel 110a including the first organic light emitting diode OLED1, the second sub-pixel 110b including the second organic light emitting diode OLED2, and the third sub-pixel 110c including the third organic light emitting diode OLED3.

First, in one of the unit pixels 120 formed in the organic light emitting display panel, the first and second sub organic light emitting diodes OLED1_1 and OLED1_2 included in the first organic light emitting diode OLED1 configuring the first sub-pixel 110a are separated from each other in a first direction vertical to the horizontal line, and the second organic light emitting diode OLED2 configuring the second sub-pixel 110b and the third organic light emitting diode OLED3 configuring the third sub-pixel 110c are disposed along the first direction. For example, when a direction of a data line is designated as a vertical direction (a first direction) and a direction of a gate line is designated as a lateral direction (a second direction), the first and second sub organic light emitting diodes OLED1_1 and OLED1_2 are vertically separated from each other on a plane view.

Here, the first direction denotes a direction vertical to the horizontal line. The gate line may be formed along the horizontal line in the organic light emitting display panel 100. In this case, the first direction may be a direction vertical to the gate line.

The first organic light emitting diode OLED1 configuring the first sub-pixel 110a is divided into the first and second sub organic light emitting diodes OLED1_1 and OLED1_2. Since the first organic light emitting diode OLED1 is divided into the first and second organic light emitting diodes OLED1_1 and OLED1_2, the first sub-pixel 110a may output more light. Therefore, the first and second organic light emitting diodes OLED1_1 and OLED1_2 may be organic light emitting diodes that express blue, but are not limited thereto. For example, the first and second organic light emitting diodes OLED1_1 and OLED1_2 may be red organic light emitting diodes or green organic light emitting diodes. Hereinafter, for convenience of description, a case in which the first and second organic light emitting diodes OLED1_1 and OLED1_2 configuring the first organic light emitting diode OLED1 are blue organic light emitting diodes will be described as an example of the present invention.

To provide an additional description, each of the unit pixels 120 configuring the organic light emitting display panel 100 includes the first organic light emitting diode OLED1, configured with the first and second organic light emitting diodes OLED1_1 and OLED1_2 which are separated from each other in the first direction, and the second and third organic light emitting diodes OLED2 and OLED3 which are separated from each other along the first direction.

Second, in each of the unit pixels 120, a contact hole 130 for electrically connecting an organic light emitting diode 113 to a driving TFT 112 which drives the organic light emitting diode 113 formed in each of the unit pixels 120 is formed between the first and second sub organic light emitting diodes OLED1_1 and OLED1_2 and between the second and third organic light emitting diodes OLED2 and OLED3.

For example, a first contact hole 131 which electrically connects a first driving TFT (which drives the first and second sub organic light emitting diodes OLED1_1 and OLED1_2) to the first and second sub organic light emitting diodes OLED1_1 and OLED1_2, a second contact hole 132 which electrically connects a second TFT (which drives the second organic light emitting diode OLED2) to the second organic light emitting diode OLED2, and a third contact hole 133 which electrically connects a third TFT (which drives the third organic light emitting diode OLED3) to the third organic light emitting diode OLED3 are formed in one row along a contact hole part Y.

Here, the contact hole part Y is formed along a second direction parallel to the horizontal line. For example, the contact hole part Y is formed near a central line which vertically divides the unit pixels 120 along the horizontal line.

To provide an additional description, the contact hole part Y is formed along the second direction parallel to the horizontal line, and particularly, is formed near the central line which vertically divides the unit pixels 120 along the horizontal line.

Third, the second organic light emitting diodes OLED2 respectively formed in the unit pixels 120 which are adjacent to each other in the first direction are adjacent to each other, and the third organic light emitting diodes OLED3 respectively formed in the unit pixels 120 which are adjacent to each other in the first direction are adjacent to each other.

For example, in a first unit pixel A1 which is formed at a left upper end among four unit pixels 120 illustrated in FIG. 3, the second and third organic light emitting diodes OLED2 and OLED3 are disposed in a vertical direction along the first direction, and particularly, the third organic light emitting diode OLED3 is disposed at a lower side. Also, in a second unit pixel A2 which is formed at a left lower end among the four unit pixels 120 illustrated in FIG. 3, the second and third organic light emitting diodes OLED2 and OLED3 are disposed in a vertical direction along the first direction, and particularly, the third organic light emitting diode OLED3 is disposed at an upper side.

Therefore, the third organic light emitting diodes OLED3 respectively formed in the first and second unit pixels A1 and A2 which are adjacent to each other in the first direction are adjacent to each other.

Moreover, in a third unit pixel A3 which is formed at a right upper end among the four unit pixels 120 illustrated in FIG. 3, the second and third organic light emitting diodes OLED2 and OLED3 are disposed in a vertical direction along the first direction, and particularly, the second organic light emitting diode OLED2 is disposed at a lower side. Also, in a fourth unit pixel A4 which is formed at a right lower end among the four unit pixels 120 illustrated in FIG. 3, the second and third organic light emitting diodes OLED2 and OLED3 are disposed in a vertical direction along the first direction, and particularly, the second organic light emitting diode OLED2 is disposed at an upper side.

Therefore, the second organic light emitting diodes OLED2 respectively formed in the third and fourth unit pixels A3 and A4 which are adjacent to each other in the first direction are adjacent to each other.

In addition, since the unit pixels 120 formed in the organic light emitting display panel 100 are formed in a pattern illustrated in FIG. 3, the second organic light emitting diodes OLED2 respectively formed in the unit pixels 120 which are adjacent to each other in the first direction are adjacent to each other, and the third organic light emitting diodes OLED3 respectively formed in the unit pixels 120 which are adjacent to each other in the first direction are adjacent to each other.

Fourth, in each of unit pixels which are adjacent to each other in the first direction, the second and third organic light emitting diodes are formed at different positions.

For example, as described above, since the second organic light emitting diodes OLED2 respectively formed in the unit pixels 120 which are adjacent to each other in the first direction are adjacent to each other, and the third organic light emitting diodes OLED3 respectively formed in the unit pixels 120 which are adjacent to each other in the first direction are adjacent to each other, the second and third organic light emitting diodes are formed at different positions in each of unit pixels which are adjacent to each other in the first direction.

Fifth, in each of unit pixels which are adjacent to each other in the second direction parallel to the horizontal line, the second and third organic light emitting diodes are formed at different positions.

For example, in the first unit pixel A1 which is formed at the left upper end among the four unit pixels 120 illustrated in FIG. 3, the second and third organic light emitting diodes OLED2 and OLED3 are disposed in the vertical direction along the first direction, and particularly, the third organic light emitting diode OLED3 is disposed at the lower side. Also, in the third unit pixel A3 which is formed at the right upper end among the four unit pixels 120 illustrated in FIG. 3, the second and third organic light emitting diodes OLED2 and OLED3 are disposed in the vertical direction along the first direction, and particularly, the third organic light emitting diode OLED3 is disposed at an upper side.

Therefore, the second and third organic light emitting diodes OLED2 and OLED3 respectively formed in the first and third unit pixels A1 and A3 which are adjacent to each other in the second direction are formed at different positions.

However, the second and third organic light emitting diodes OLED2 and OLED3 respectively formed in the first and third unit pixels A1 and A3 which are adjacent to each other in the second direction may be formed at the same position. For example, the third unit pixel A3 which is formed at the right upper end among the four unit pixels 120 illustrated in FIG. 3 may be formed in the same type as that of the first unit pixel A1 which is formed at the left upper end among the four unit pixels 120 illustrated in FIG. 3.

Sixth, the contact hole part Y may be formed to be covered by a bank. This will be described in detail with reference to FIG. 6.

Seventh, a first electrode or second electrode of the organic light emitting diode 113 is electrically connected to the driving TFT 112 through the contact hole 130.

For example, the first electrode or the second electrode may be the anode electrode or the cathode electrode, and is electrically connected to the driving TFT 112 through the contact hole 130.

Figure 6:
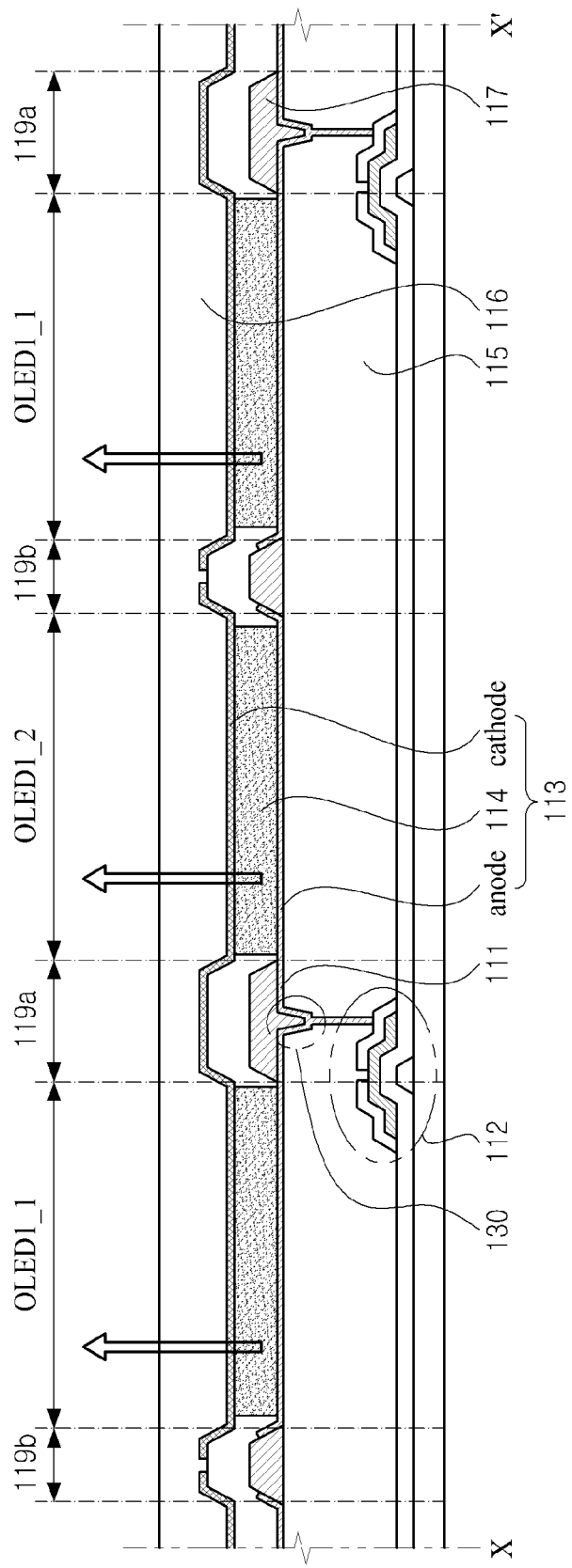
FIG. 6 is an exemplary diagram illustrating a cross-sectional surface taken along line X-X' of the organic light emitting display panel of FIG. 5.

FIG. 6 is an exemplary diagram illustrating a cross-sectional surface taken along line X-X' of the organic light emitting display panel of FIG. 5.

The organic light emitting display panel 100 according to the embodiments of the present invention, as illustrated in FIG. 6, includes a sub-pixel 110 based on a top emission type. Since FIG. 6 illustrates a cross-sectional surface taken along line X-X' of the organic light emitting display panel of FIG. 5, a second bank part 119b, a first sub organic light emitting diode OLED1_1, a first bank part 119a, a second sub organic light emitting diode OLED1_2, a second bank part 119b, a first sub organic light emitting diode OLED1_1, and a first bank part 119a are formed in this order from a left side in the organic light emitting display panel illustrated in FIG. 6.

First, the second bank part 119b divides the unit pixels 120 in the first direction. Therefore, a bank 117 is formed in the second bank part 119b.

Second, as described above, the first sub organic light emitting diode OLED1_1 is an organic light emitting diode configuring the first sub-pixel.

Third, the contact hole 130 and the bank 117 covering the contact hole 130 are formed in the first bank part 119a. In this case, the connection line 111 is formed in the contact hole 130, and a first electrode (an anode) of the first sub organic light emitting diode OLED1_1 is connected to a first electrode (an anode) of the second sub organic light emitting diode OLED1_2 through the connection line 111.

The driving TFT 112 may be formed at a lower end of the first bank part 119 with a planarizing layer 115 therebetween.

Fourth, the second sub organic light emitting diode OLED1_2 is an organic light emitting diode configuring the first sub-pixel.

The first and second sub organic light emitting diodes OLED1_1 and OLED1_2 configure the first organic light emitting diode OLED1 configuring the first sub-pixel.

Since the first and second sub organic light emitting diodes OLED1_1 and OLED1_2 are electrically connected to the driving TFT 112 through the connection line 111, the first and second sub organic light emitting diodes OLED1_1 and OLED1_2 are simultaneously driven by the driving TFT 112.

The first and second sub organic light emitting diodes OLED1_1 and OLED1_2 each include a first electrode used as an anode electrode, a second electrode used as a cathode electrode, and an emission layer 114 formed between the first and second electrodes.

A protective layer 116 may be stacked on the second electrode (a cathode), and a color filter (not shown in FIG. 6) may be formed on the protective layer 116. However, the color filter may not be provided, or may be formed at another position.

Fifth, as described above, the second bank part 119b divides the unit pixels 120 in the first direction. In FIG. 4, the second bank part 119b formed between the first and second sub organic light emitting diodes OLED1_1 and OLED1_2, and divides the first and second unit pixels illustrated in FIG. 3.

Sixth, the first sub organic light emitting diode OLED1_1 formed at a right side of FIG. 6 performs the same function as that of the above-described first sub organic light emitting diode OLED1_1, and the first bank 119a formed at the right side of FIG. 6 performs the same function as that of the above-described first bank 119a.

Figure 7:
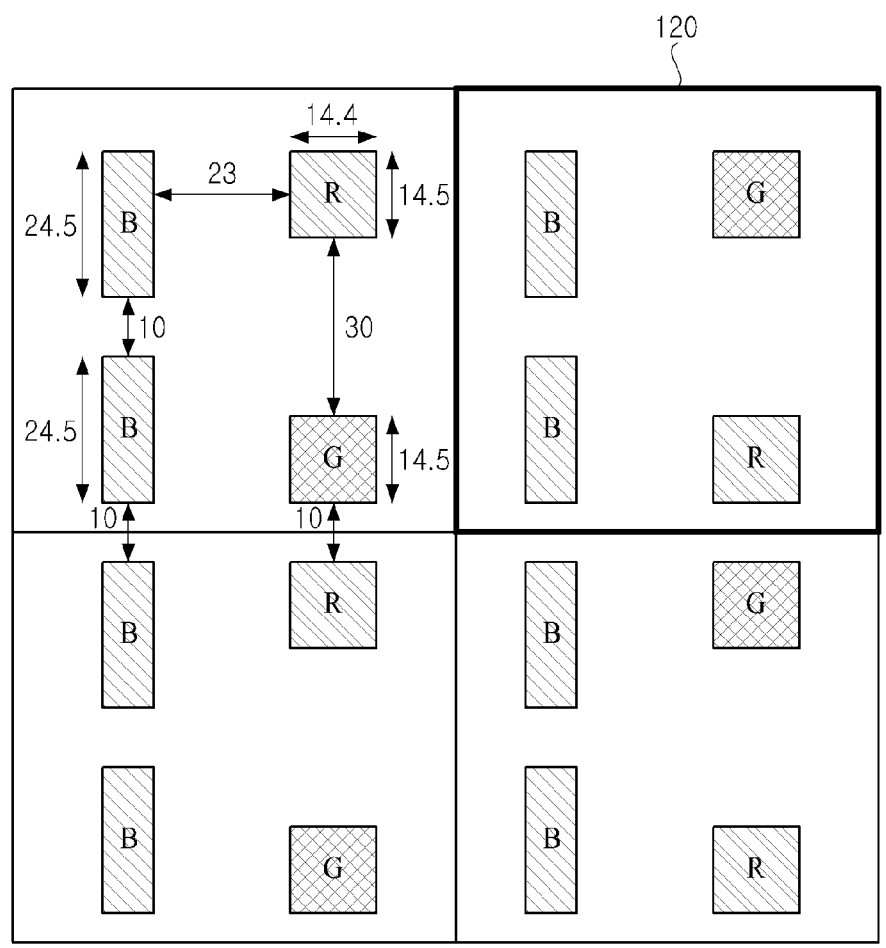
FIG. 7 is an exemplary diagram illustrating an example of an interval between OLEDs in the organic light emitting display panel of FIG. 5.

FIG. 7 is an exemplary diagram illustrating an interval between the organic light emitting diodes in the organic light emitting display panel of FIG. 5. In FIG. 7, a unit of a numerical value may be μm.

In the organic light emitting display panel according to the third embodiment of the present invention, as illustrated in FIG. 7, organic light emitting diodes of the same color may be formed in adjacent areas in unit pixels which are adjacent to each other in the first direction.

Therefore, in pixels which are adjacent to each other in the first direction, an interval between two adjacent organic light emitting diodes may be, for example, 10 μm. In the related art, in pixels which are adjacent to each other in the first direction, an interval between two adjacent organic light emitting diodes may be about 30 μm. However, according to the present embodiment, the interval is reduced by 20 μm. Therefore, according to the present embodiment, an opening is further widened.

The above-described organic light emitting display panel according to the third embodiment of the present invention will be briefly described below.

In an organic light emitting display panel where colors are alternated in units of two colors and which is formed in a pixel structure where a contact hole is formed at a lower end of a pixel, two sub-pixels may be formed by using one slot hole, and thus, a distance between slots is reduced, thereby increasing an area of an opening. That is, considering the same aperture ratio, a high resolution is realized. However, considering both the structure and a driving TFT, a contact hole is formed between the same colors facing each other, and thus, an increase effect of an opening is reduced.

Therefore, a method in which a position of the contact hole 130 is differently provided was proposed for maximizing an increase effect of an area of an opening of a fine metal mask. In this case, however, in designing the driving TFT, positions of a line and the driving TFT deviate from the original positions, and thus, an additional area necessary for designing is needed, whereby implementation of a high resolution is limited.

According to the third embodiment of the present invention, the organic light emitting display panel has a color alternation structure and a structure for maximizing an increase effect of an area of an opening, and as illustrated in FIG. 5, the contact hole 130 is disposed between different colors. Also, according to the present embodiment, in a case of a color (generally, blue) using a slit mask, one organic light emitting diode (the first organic light emitting diode OLED1 in FIG. 3) is separated into two sub organic light emitting diodes by the bank in order for the contact hole 130 to be disposed on the same line.

That is, in the present embodiment, the contact hole 130 is disposed in a pixel using the slit mask, and the bank is formed at a position of the contact hole 130. Therefore, non-planarization of the contact hole 130 can be prevented, and thus, a deposition failure of the organic light emitting display panel can be prevented.

To provide an additional description, in the present embodiment, an emission part is formed by dividing a sub-pixel using the slit mask into two segments, thereby realizing a high resolution.

Further, in the present embodiment, a structure in which the same colors face each other is used, thereby securing an opening.

Furthermore, in the present embodiment, since the contact hole connected to the driving TFT is disposed at the same position, a high-resolution organic light emitting display panel is designed.

Moreover, in the present embodiment, since the bank is formed on the contact hole, a deposition failure of the organic light emitting display panel caused by a high step height can be prevented.

In the organic light emitting display panel according to the embodiments of the present invention, a plurality of unit pixels that each include first to third sub-pixels respectively including OLEDs of different colors are arranged in a matrix type.

In the present invention where a plurality of unit pixels are arranged in a matrix type, sub-pixels having the same color among a plurality of sub-pixels configuring a unit pixel may be arranged adjacent to each other, thereby enhancing a sense of color.

Further, according to the embodiments of the present invention, since first to third sub-pixels configuring a unit pixel are respectively disposed adjacent to first to third sub-pixels adjacent thereto, a width of an emission area can increase.

Moreover, according to the embodiments of the present invention, a non-deposition of an OLED and a non-emission of a pixel which are caused by a non-planarization of a contact hole in a bank open area can be prevented.

Particularly, in one unit pixel applied to the organic light emitting display panel according to the third embodiment of the present invention, the first OLEDs configuring the first sub-pixel are vertically separated from each other and are respectively included in the upper sub-pixel and the lower sub-pixel, and the second OLED configuring the second sub-pixel and the third OLED configuring the third sub-pixel are disposed upward and downward. Therefore, according to the third embodiment of the present invention, sub-pixels included in adjacent unit pixels are arranged adjacent to a boundary between adjacent unit pixels, thereby enhancing an aperture ratio of each unit pixel. Also, in designing the fine metal mask used to form a sub-pixel of a unit pixel, the rib of the fine metal mask may be thinly designed, and thus, the present invention contributes to manufacture a high-resolution organic light emitting display panel.

In addition, in the embodiments of the present invention, the contact holes may be arranged in one row in a certain direction, and thus, it is easy to manufacture the fine metal mask. Also, second and third sub-pixels configuring a unit pixel may be respectively disposed adjacent to second and third sub-pixels configuring an adjacent unit pixel, and thus, it is possible to manufacture the fine metal mask for enhancing an aperture ratio. In particular, in manufacturing a high-resolution organic light emitting display panel, the manufacturing of the fine metal mask is limited, but the present invention overcomes the limitation, and enables a finer sub-pixel to be manufactured. Also, in the present invention, sub-pixels are arranged in parallel in a unit pixel, and thus, it is easy to manufacture the fine metal mask.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display panel, comprising:
   a plurality of unit pixels, each including first to third sub-pixels having different colors,
   wherein each of the plurality of unit pixels includes first to third driving transistors respectively connected to the first to third sub-pixels, a first contact hole that connects the first sub-pixel to the first driving transistor, a second contact hole that connects the second sub-pixel to the second driving transistor, and a third contact hole that connects the third sub-pixel to the third driving transistor, and the plurality of unit pixels are arranged in a matrix,
   a plurality of the first sub-pixels are arranged adjacent to each other in unit pixels which are adjacent to each other in a first direction,
   a plurality of the third sub-pixels are arranged adjacent to each other at a boundary of respectively adjacent two unit pixels, wherein the two adjacent unit pixels form a unit pixel pair, and
   a plurality of the second sub-pixels, wherein the second sub-pixel of a pixel unit is adjacent to the third sub-pixel in the unit pixel in the first direction, and is arranged farther apart from the boundary of the two adjacent unit pixels of the unit pixel pair than the third sub-pixels of the unit pixel pair.

2. The organic light emitting display panel of claim 1, wherein the first to third contact holes are disposed adjacent to a boundary of the unit pixels which are adjacent to each other in the first direction.

3. The organic light emitting display panel of claim 1,
   wherein the first contact hole is disposed between the plurality of the first sub-pixels which are adjacent to each other in the first direction, and
   wherein the second and third contact holes may be disposed between the second sub-pixel and the third sub-pixel of a respective pixel unit.

4. The organic light emitting display panel of claim 1,
   wherein the first sub-pixel comprises an upper sub-pixel and a lower sub-pixel in the unit pixel,
   wherein the first contact hole is disposed between the upper sub-pixel and the lower sub-pixel of the pixel unit, and
   wherein the second and third contact holes are disposed between the second sub-pixel and the third sub-pixel of the pixel unit.

5. The organic light emitting display panel of claim 4, wherein the first to third contact holes are arranged in parallel in a second direction, wherein the second direction is perpendicular to the first direction.

6. The organic light emitting display panel of claim 5, wherein the first to third sub-pixels are disposed adjacent to one of first to third sub-pixels, included in an adjacent unit pixel, at a boundary of unit pixels.

7. The organic light emitting display panel of claim 1, wherein the first sub-pixel is greater than the second and third sub-pixels, and comprises a blue organic emission layer.

* * * * *